United States Patent
Ide et al.

(10) Patent No.: US 10,204,838 B2
(45) Date of Patent: Feb. 12, 2019

(54) HANDLE SUBSTRATE OF COMPOSITE SUBSTRATE FOR SEMICONDUCTOR, AND COMPOSITE SUBSTRATE FOR SEMICONDUCTOR

(71) Applicant: NGK INSULATORS, LTD., Aichi-prefecture (JP)

(72) Inventors: Akiyoshi Ide, Kasugai (JP); Tatsuro Takagaki, Nagoya (JP); Sugio Miyazawa, Kasugai (JP); Yasunori Iwasaki, Kitanagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 15/237,809

(22) Filed: Aug. 16, 2016

(65) Prior Publication Data

US 2016/0358828 A1    Dec. 8, 2016

Related U.S. Application Data

(63) Continuation of application No. PCT/JP2015/054253, filed on Feb. 17, 2015.

(30) Foreign Application Priority Data

Feb. 18, 2014   (JP) ................................. 2014-028241

(51) Int. Cl.
*H01L 21/762* (2006.01)
*H01L 21/86* (2006.01)
(Continued)

(52) U.S. Cl.
CPC ........ *H01L 21/86* (2013.01); *H01L 21/31053* (2013.01); *H01L 21/32105* (2013.01);
(Continued)

(58) Field of Classification Search
CPC ......... H01L 21/76254; H01L 21/76259; H01L 21/76251; H01L 21/02002; H01L 21/187;
(Continued)

(56) References Cited

U.S. PATENT DOCUMENTS 5,492,859 A    2/1996  Sakaguchi et al.
6,287,941 B1 *  9/2001  Kang .................. H01L 21/2007
                                                257/E21.122
(Continued)

FOREIGN PATENT DOCUMENTS

EP      0553855 A2     8/1993
JP     06-183046 A     7/1994
(Continued)

OTHER PUBLICATIONS

International Preliminary Report on Patentability for PCT Patent App. No. PCT/JP2015/054253 dated Sep. 1, 2016.
(Continued)

*Primary Examiner* — Khiem D Nguyen
(74) *Attorney, Agent, or Firm* — Cermak Nakajima & McGowan LLP; Tomoko Nakajima

(57) ABSTRACT

A handle substrate of a composite substrate for a semiconductor includes a base substrate comprising a polycrystalline material; and an amorphous layer provided over the base substrate, the amorphous layer having chemical resistance and comprising a single component with a high purity.

2 Claims, 2 Drawing Sheets

(51) Int. Cl.
  *H01L 21/3105* (2006.01)
  *H01L 21/321* (2006.01)
  *H01L 27/12* (2006.01)

(52) U.S. Cl.
  CPC .. *H01L 21/76251* (2013.01); *H01L 21/76256* (2013.01); *H01L 27/1203* (2013.01)

(58) Field of Classification Search
  CPC .. H01L 21/185; H01L 21/86; H01L 21/76256
  See application file for complete search history.

(56) References Cited

U.S. PATENT DOCUMENTS

| | | | | |
|---|---|---|---|---|
| 6,437,943 | B1* | 8/2002 | Yokote | G11B 5/10 360/235.3 |
| 7,759,217 | B2* | 7/2010 | Henley | B81C 1/0038 257/E21.568 |
| 2003/0008475 | A1* | 1/2003 | Cheung | H01L 21/76251 438/455 |
| 2003/0129780 | A1* | 7/2003 | Auberton-Herve | H01L 21/76254 438/46 |
| 2005/0151155 | A1 | 7/2005 | Auberton-Nerve | |
| 2009/0209059 | A1* | 8/2009 | Isaka | H01L 31/022425 438/74 |
| 2009/0221131 | A1* | 9/2009 | Kubota | C30B 19/12 438/478 |
| 2010/0123409 | A1* | 5/2010 | Hsieh | H05B 41/14 315/248 |
| 2011/0003462 | A1* | 1/2011 | Akiyama | H01L 21/30608 438/459 |
| 2012/0161291 | A1* | 6/2012 | Bruel | C30B 29/06 257/618 |
| 2014/0191373 | A1* | 7/2014 | Iwasaki | H01L 21/76251 257/618 |

FOREIGN PATENT DOCUMENTS

| | | |
|---|---|---|
| JP | 2000-502483 A | 2/2000 |
| JP | 2004-503942 A | 2/2004 |
| JP | 2010-010411 A | 1/2010 |
| JP | 2010-028099 A | 2/2010 |
| JP | 2014-154687 A | 8/2014 |
| WO | WO2014/013980 A1 | 1/2014 |

OTHER PUBLICATIONS

International Search Report and Written Opinion for PCT Patent App. No. PCT/JP2015/054253 dated May 19, 2015 with English language translation of the ISR.
Kutchoukov, V. G., et al., "Fabrication of nanofluidic devices using glass-to-glass anodic bonding," Sensors and Actuators A 2004;114:521-527.
Sarro, P. M., "Silicon carbide as a new MEMS technology," Sensors and Actuators A 2000;82:210-218.
Extendede European Search Report for European Patent App. No. 15752589.0 dated Oct. 9, 2017.
Office Action from Taiwan Patent App. No. 104105514 dated May 31, 2018.

* cited by examiner

HANDLE SUBSTRATE OF COMPOSITE SUBSTRATE FOR SEMICONDUCTOR, AND COMPOSITE SUBSTRATE FOR SEMICONDUCTOR

TECHNICAL FIELD

The present invention relates to a handle substrate of a composite substrate for semiconductors and a composite substrate for semiconductors.

BACKGROUND ART

Conventionally, a bonded wafer is known to be produced by bonding a silicon on insulator (SOI) as a handle substrate made of a transparent insulating substrate, called a silicon on quartz (SOQ), a silicon on glass (SOG) or a silicon on sapphire (SOS), or a transparent wide-gap semiconductor made of GaN, ZnO, diamond, AlN, etc., to a donor substrate made of silicon or the like. The SOQ, SOG, SOS, etc. are expected to be applied to projectors, high-frequency devices, and the like from the need to attain insulation and transparency for the handle substrate. Furthermore, a bonded wafer that has a composite structure of a thin film made of the wide-gap semiconductor and the handle substrate is also expected to be applied to high-performance lasers, power devices, and the like.

Such a composite substrate for semiconductors is configured of the handle substrate and the donor substrate. In general, each of the handle substrate and the donor substrate is made up of a monocrystalline material. In the related art, a mainstream method for forming these substrates involves forming a silicon layer on a base substrate by epitaxial growth. On the other hand, in recent years, a method that directly bonds a silicon layer on a base substrate has been developed to contribute to improving the performance of semiconductor devices. That is, the handle substrate and donor substrate that are obtained in this manner are bonded together directly or via a bonding layer or an adhesive layer.

However, since sapphire is expensive, a substrate made of any material other than sapphire is desired to be used as the handle substrate in order to reduce the cost. Thus, a glazed glass layer or an amorphous layer is known to be formed as a surface layer of the handle substrate (see Patent Documents 1 and 2).

The handle substrate to be used for bonding to the donor substrate is subjected to high precision-polishing by chemical-mechanical planarization (CMP) and the like to decrease its surface roughness Ra in order to maximize a bonding force caused by the intermolecular force. However, the composite substrate completed in this way is sometimes exposed to an atmospheric temperature close to 1000° C. during various semiconductor processes. For this reason, the composite substrate is desired to endure the heat in the high-temperature process after the bonding while simultaneously keeping the Ra value of the surface of the handle substrate low in order to maximize the bonding force by intermolecular force.

CITATION LIST

Patent Document

Patent document 1: Japanese Patent Publication No. Hei 06 (1994)-18304A

Patent Document 2: Japanese Patent Publication No. 2000-502483A

SUMMARY OF INVENTION

However, when forming the glazed glass layer on the surface of the handle substrate, the glass has a glass-transition temperature, and thus is difficult to use under a high temperature of 700° C. or higher. Further, the glass has a large amount of impurities. Thus, the glass is not appropriate for the semiconductor process.

On the other hand, when forming the handle substrate from a polycrystalline material, it is difficult to ensure the complete densification of the handle substrate, and the polishability varies depending on the crystal orientations of the polycrystalline material, thus making it difficult to obtain the surface roughness that can withstand the bonding.

Patent Document 2 describes that a nonporous layer made of amorphous alumina is attached to a wafer and polished until it has an average surface roughness of 5 angstroms (Å) or less.

In recent years, however, wiring rules of semiconductors have been further miniaturized. For example, a fine wiring of 0.7 µm or less is adopted. Thus, metallic pollution (metal contamination) at the level that could not be an issue in the related art has become problematic. For this reason, the handle substrate is required to be cleaned to a high standard, arising from a concern about the deterioration of the performance of semiconductor devices. However, the handle substrate made of a general ceramic sintered body does not reach such a high standard of cleanness. In addition, an amorphous alumina coating, such as that described in Patent Document 2, cannot handle the prevention of the metallic pollution at a high level as mentioned above.

It is an object of the present invention to provide a handle substrate of a composite substrate for semiconductors, which has adequate high-temperature endurance and is capable of decreasing a surface roughness of a bonding surface to a donor substrate for improving a bonding strength with the donor substrate, and to reduce contamination at the bonding surface, without using an expensive monocrystalline material.

The present invention provides a handle substrate of a composite substrate for a semiconductor, the handle substrate comprising:

a base substrate comprising a polycrystalline material; and an amorphous layer provided over the base substrate, said amorphous layer having chemical resistance and comprising a single component with a high purity.

Further, the present invention provides a composite substrate for a semiconductor, the composite substrate comprising the handle substrate and a donor substrate bonded to the bonding surface of the handle substrate.

Moreover, the present invention provides a method for manufacturing a handle substrate of a composite substrate for a semiconductor, the method comprising the step of:

forming an amorphous layer over a base substrate comprising a polycrystalline material, the amorphous layer having chemical resistance and comprising a single component with a high purity.

Accordingly, the present invention can provide a handle substrate of a composite substrate for semiconductors that is not made using expensive monocrystalline material, has adequate high-temperature endurance, and can decrease the surface roughness of the bonding surface to enhance the bonding strength with the donor substrate. For example, its surface roughness can be reduced to 1 nm or less.

By annealing the thin layer of the polycrystalline material, the densification of the amorphous layer can be improved, whereby the chemical resistance can be enhanced by such improved densification, which makes it possible to use chemicals appropriate for cleaning of semiconductors in the handle substrate of the invention. Thus, a cleaning effect of the bonding surface can be enhanced, thereby reducing the contamination level. The contamination level of the bonding surface can be reduced, for example, to $1.0 \times 10^{11}$ atom/cm² or less for each of target metal elements.

PREFERRED EMBODIMENTS OF THE INVENTION

The present invention will be further described in detail below with reference to the accompanying drawings.

Figure 1A:
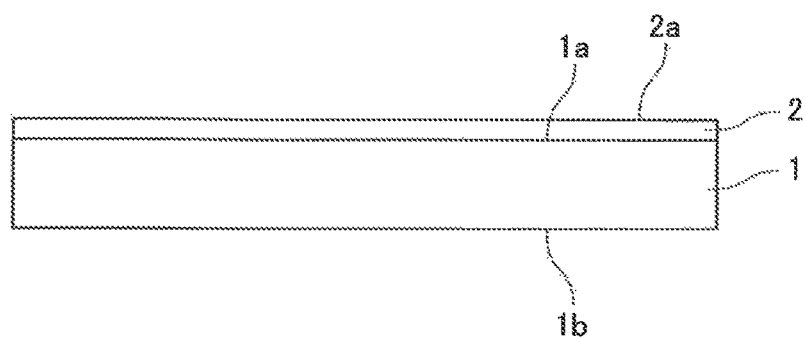
FIG. 1(a) shows a state in which an amorphous layer 2 is formed on a base substrate 1 made of a polycrystalline material.
Figure 1B:
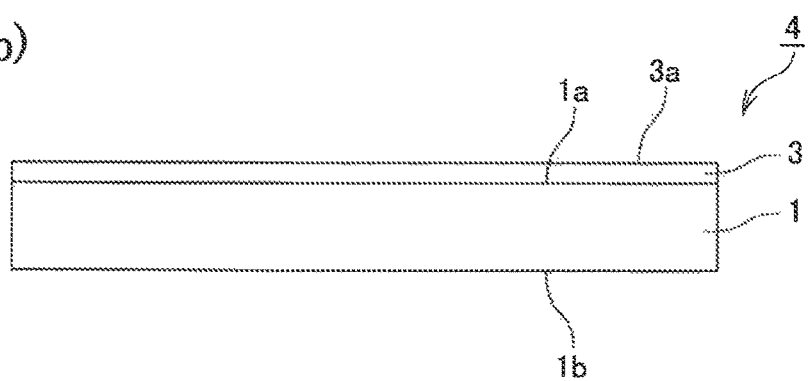
FIG. 1(b) shows a handle substrate 4 obtained by performing precision-polishing on the amorphous layer 2.

For example, as shown in FIG. 1(a), an amorphous thin layer 2 is formed on a surface 1a of a base substrate 1 made of a polycrystalline material. Reference character 1b denotes a back surface. Subsequently, the substrate is annealed to densify the amorphous thin layer 2. Then, a surface 2a is subjected to precision-polishing, thereby forming an amorphous layer 3 with a bonding surface 3a having an extremely small surface roughness. In this way, a handle substrate 4 can be obtained.

Figure 2A:
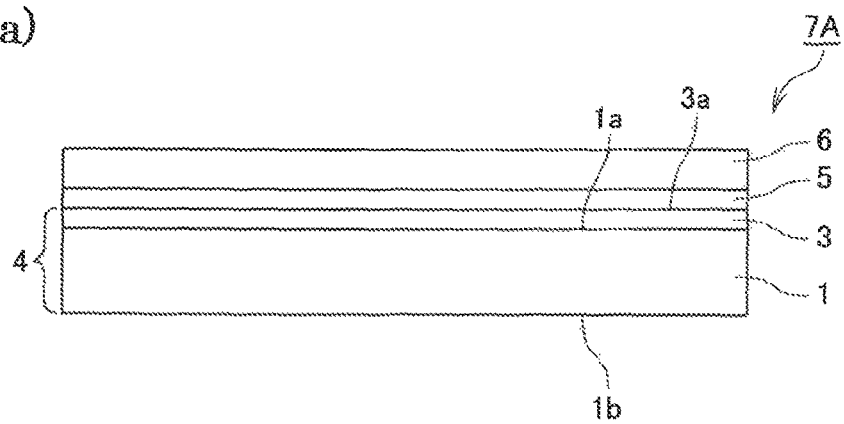
FIG. 2(a) shows a composite substrate 7A obtained by bonding a donor substrate 6 to the handle substrate 4 via a bonding layer 5.
Figure 2B:
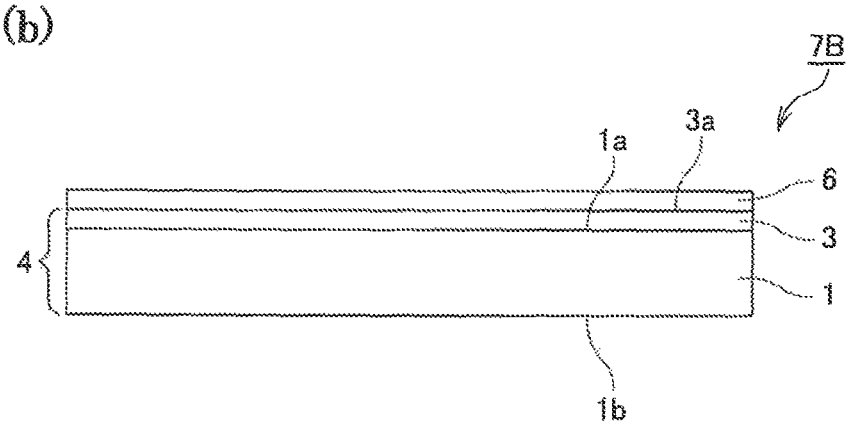
FIG. 2(b) shows a composite substrate 7B obtained by directly bonding the donor substrate 6 to the handle substrate 4.

Next, in an example shown in FIG. 2(a), a donor substrate 6 is bonded to the bonding surface 3a of the handle substrate 4 via a bonding layer 5, thereby producing a composite substrate 7A. Further, in an example shown in FIG. 2(b), the donor substrate 6 is bonded directly to the bonding surface 3a of the handle substrate 4, thereby producing a composite substrate 7B.

(Applications)

The composite substrate of the invention may be applied to light-emitting elements for projectors, high-frequency devices, high-performance lasers, power devices, logic IC, etc.

(Donor Substrate)

The composite substrate includes the handle substrate of the invention and the donor substrate.

Material for the donor substrate is not specifically limited, but is preferably selected from the group consisting of silicon, aluminum nitride, gallium nitride, zinc oxide and diamond.

The donor substrate contains the above-mentioned material, and may have an oxide film on its surface. This is because ion implantation through the oxide film can exhibit the effect of suppressing channeling of implanted ions. The oxide film preferably has a thickness of 50 to 500 nm. The donor substrate having the oxide film can be included in the concept of the donor substrate in the invention unless otherwise specified, and is hereinafter referred to as the donor substrate.

(Base Substrate)

In a preferred embodiment, polycrystalline material for forming the base substrate includes an alumina, silicon nitride, aluminum nitride, or silicon oxide. These materials are preferable because they are more likely to enhance the densification and less likely to contaminate semiconductors.

A relative density of the polycrystalline material forming the base substrate is preferably 98% or more, and further preferably 99% or more, in terms of decreasing the surface roughness of the bonding surface of the amorphous layer.

In a preferred embodiment, the polycrystalline material forming the handle substrate is manufactured by sintering ceramic powder having a purity of 99.9% or more as raw material.

In particular, suppose that pits (holes) in the substrate surface affect an yield ratio of the semiconductors, or that there are strict requirements for suppressing the metallic pollution level in semiconductor process, for example, pollution or contamination is required to be reduced to a concentration of $1.0 \times 10^{11}$ atom/cm² or less for each target metal element. In such a case, the base substrate is desired to have a higher purity. This is because even a small amount of metal in the base substrate might be diffused into the amorphous layer to be possibly exposed at the surface of the handle substrate. Impurities scattering from the base substrate might be attached to the surface of the amorphous layer.

A highly-dense translucent alumina having a high purity may be used for the base substrate. In this case, preferably, 100 ppm or more and 300 ppm or less of magnesium oxide powder is added to high-purity alumina powder having a purity of 99.9% or more (preferably 99.95% or more). This kind of high-purity alumina powder can be, for example, high-purity alumina powder manufactured by TAIMEI CHEMICALS Co., Ltd. The purity of magnesium oxide powder is preferably 99.9% or more, and preferably has an average particle size of 50 μm or less.

In a preferred embodiment, zirconia ($ZrO_2$) and yttria ($Y_2O_3$) are preferably added as sintering agents at concentrations of 200 to 800 ppm and 10 to 30 ppm, respectively, to the alumina powder.

Forming methods for the base substrate may include, but not limited to, any method, such as a doctor blade method, an extrusion process, and a gel cast method. In particular, preferably, the base substrate is manufactured using the gel cast method.

In a preferred embodiment, a slurry containing the ceramic powder, a dispersion medium, and a gellant is produced, and then charged into a mold cavity to be allowed to gelate, thereby producing a molded body. Here, in the gel-forming stage, a mold-release agent is applied to mold parts, followed by assembling the mold parts into a mold, and then the slurry is charged into the mold. Sequentially, the gel is hardened in the mold, thereby producing the molded body, which is then released from the mold. Thereafter, the mold is cleaned.

Then, the gel-molded body is dried, preferably temporarily sintered in the atmosphere, and then sintered in hydrogen. The sintering temperature in the sintering is preferably in a range of 1700 to 1900° C., and further preferably in a range of 1750 to 1850° C. in terms of the densification of the sintered body.

After producing the sufficiently dense sintered body during the sintering, an additional annealing process is further performed to enable correction of warpage. From the viewpoint of promoting the discharge of the sintering agent while preventing the deformation and occurrence of abnormal grain growth, the annealing temperature is preferably set within the "maximum temperature of the sintering process ±100° C.", and furthermore, the maximum temperature of the annealing temperature is preferably 1900° C. or lower. An annealing time is preferably set at one to six hours.

(Amorphous Layer)

In the invention, the amorphous layer is formed on the base substrate made of the polycrystalline material.

To obtain the surface roughness enough to ensure the bonding to the donor substrate, it is important to reduce the crystallinity of the surface layer, that is, to bring the surface layer into an amorphous state. When the surface layer has some crystallinity, the polishing with the CMP causes an uneven surface depending on the crystal orientation, whereby a desired surface roughness Ra cannot be obtained. Further, the amorphous layer on the base substrate is annealed, thereby enhancing the resistance to chemicals. Thus, the chemicals suitable for cleaning the semiconductors can be applied to the amorphous layer, so that contamination on the amorphous surface can be reduced.

Here, the chemicals used in the cleaning can include various chemicals, which are any chemical solutions used for RCA cleaning of a Si wafer. For example, an ammonia hydrogen peroxide (ammonia:hydrogen peroxide:$H_2O$=1:1:5 (volume ratio)) and a hydrochloric acid hydrogen peroxide (HCl: hydrogen peroxide:$H_2O$=1:1:5 (volume ratio)) can be exemplified as such chemicals. The amorphous layer has the adequate resistance to these chemicals, and thus can suppress the metallic pollution to $1.0 \times 10^{11}$ atom/$cm^2$ or less while maintaining the surface roughness after the cleaning.

The term "amorphous state" as herein means a state in which no crystal grain boundary is observed as a result of examining a cross section of the base substrate and a deposited layer with a scanning electron microscope (SEM) at a magnification of 10000.

The material for the amorphous layer on the base substrate is made of a single component and has a high purity. The single component means material represented by one kind of composition formula, and is typified by ceramic. This expression excludes compositions with a plurality of kinds of inorganic components, such as glass.

The term "high purity" as used herein means 98.0% or more by mass of the amorphous layer is made of the above-mentioned single component. The ratio of the above-mentioned single component in the amorphous layer is further preferably 99.0% or more by mass, and more preferably 99.5% or more by mass.

The chemicals associated with the chemical resistance indicate ammonia hydrogen peroxide, as well as hydrochloric acid hydrogen peroxide as described above. The resistance to such chemicals means that the surface roughness Ra does not change before and after the cleaning as a result of observation of the surface with an atomic force microscope (AFM). The cleaning involves cleaning at a temperature of 70 to 80° C. for a cleaning time of 10 minutes with the above-mentioned ammonia hydrogen peroxide (ammonia: hydrogen peroxide:$H_2O$=1:1:5 (volume ratio)), and then cleaning at a temperature of 70 to 80° C. for a cleaning time of 10 minutes with the hydrochloric acid hydrogen peroxide (HCl: hydrogen peroxide:$H_2O$=1:1:5 (volume ratio)).

In a preferred embodiment, the amorphous layer is made of alumina, silicon nitride, aluminum nitride or silicon oxide. These have a high purity and are suitable for use as high-frequency material or thermal conducting material.

For example, the amorphous layer made of alumina may be formed on the base substrate made of aluminum nitride. In this case, the amorphous layer made of alumina can obtain the desired surface roughness while maintaining the high thermal conductivity by the aluminum nitride, and additionally, the improvement of the corrosion resistance can be expected by the alumina.

In a preferred embodiment, the polycrystalline material and the amorphous layer are made of the same kind of material. This is effective in preventing the occurrence of cracks due to a difference in thermal expansion between the polycrystalline material and the amorphous layer. Note that the term "the same kind of material" as used herein means that the polycrystalline material forming the base substrate and the material forming the amorphous layer are represented by the same composition formula. However, the polycrystalline material of the base substrate and the material for the amorphous layer may differ in the sintering agent, additive, or manufacturing method.

In a preferred embodiment, the thickness of the amorphous layer is 3 μm or less. Even when the polycrystalline material and the material for the amorphous layer are made of the same kind of material, the amorphous state and the polycrystalline state differ in coefficient of thermal expansion. Thus, if the handle substrate with the amorphous layer formed thereon is used at a high temperature of 1000° C. or higher, cracks might be caused. To prevent such cracks, it is effective to thin the amorphous layer. Taking into consideration the decrease in the surface roughness and the CMP workability, the thickness of the amorphous layer is desirably 3 μm or less. From the viewpoint of obtaining the desired surface roughness, the thickness of the amorphous layer is preferably 0.5 μm or more.

Suitable formation methods for the thin amorphous layer include chemical vapor deposition (CVD), sputtering, ion plating, and vapor deposition.

In a method for forming the amorphous film of silicon oxide ($SiO_2$) on the base substrate, first, an amorphous Si layer or a poly-Si layer is formed on the base substrate, and then oxidized. In this way, an amorphous layer of silicon oxide ($SiO_2$) can be formed on the polycrystalline surface.

Suitable formation methods for the amorphous Si layer and the Poly-Si layer include the CVD, sputtering, ion plating, and vapor deposition. Furthermore, the amorphous Si layer and the Poly-Si layer are processed by the CMP, so that their surface roughnesses Ra are further preferably 1 nm or less.

After forming the amorphous thin layer, the annealing process is performed. This can remove the intrinsic stress and improve the chemical resistance by the densification of the film.

An annealing temperature in the annealing process is preferably in a range of 500 to 1000° C., and further preferably in a range of 600 to 800° C. A holding time at the annealing temperature is preferably in a range of 1 to 10 hours, and further preferably in a range of 2 to 6 hours. A rate of temperature increase and a rate of temperature decrease in the annealing process are preferably in a range of 50 to 200° C./hour.

When the amorphous layer is made of alumina, preferably, the amorphous layer is heated at a rate of temperature increase of 50 to 150° C./hour to an annealing temperature of 650° C. to 1000° C., and is then kept at the annealing temperature for 2 to 4 hours.

After the annealing process, the surface roughness Ra can be reduced to 1 nm or less by the CMP processing. Thus, the adequate surface roughness of the amorphous layer required to directly bond to the donor substrate can be obtained.

The surface roughness Ra is a value determined by taking an image of part of the bonding surface in a range of the field of view of 70 μm×70 μm with an atomic force microscope (AFM) and performing calculation based on the image in accordance with JIS B0601.

The amorphous layer is subjected to the precision-polishing to decrease the surface roughness Ra of the bonding surface. As such precision-polishing, a chemical mechanical polishing (CMP) is commonly used. An abrasive slurry for use in the polishing is formed by dispersing abrasive grains having a particle size of 30 nm to 200 nm into an alkali or neutral solution. Examples of material suitable for use in the abrasive grains can include silica, alumina, diamond, zirconia, and ceria. One of these materials is used alone or in combination with other materials described above. An abrasive pad can be, for example, a rigid urethane pad, a nonwoven fabric pad, or a suede pad.

On the bonding surface of the amorphous layer, the concentration of a target metal element, especially, each of Na, Mg, K, Ca, Ti, Cr, Fe, Ni, Cu, and Zn, is preferably set at $1.0 \times 10^{11}$ atom/cm$^2$ or less.

(Composite Substrate)

The handle substrate and the donor substrate are bonded together to thereby produce the composite substrate.

Techniques for use in the bonding include, but not limited to, for example, direct bonding by surface activation, and a substrate bonding technique using an adhesive layer.

In the direct bonding, a low-temperature bonding technique by interfacial activation is preferably used. The surface activation is performed by Ar gas under a vacuum state of about $10^{-6}$ Pa, and then monocrystalline material, such as Si, can be bonded to the polycrystalline material at normal temperature via an adhesive layer made of SiO$_2$ and the like. The direct bonding by plasma activation of the surface can be suitably used. As the conditions for the direct bonding, a N$_2$ plasma is applied to the target surface after a washing process with water, and monocrystalline material, such as Si, can be bonded with polycrystalline material via an oxidation layer made of SiO$_2$ or the like under the atmospheric pressure.

Examples of the adhesive layer suitable for use include SiO$_2$, Al$_2$O$_3$, and SiN, in addition to bonding using a resin.

EXAMPLES

Example 1

To confirm the effects of the invention, an amorphous alumina layer was formed on a base substrate made of translucent alumina ceramic by vapor deposition, thereby producing a sample of a handle substrate.

First, a blank substrate made of translucent alumina ceramic was fabricated. Specifically, slurry containing a mixture of the following components was prepared.
(Powdery Raw Material)
α-alumina powder having a specific surface area of 3.5 to 4.5 m$^2$/g and an average primary particle size of 0.35 to 0.45 μm

|  | 100 weight parts |
| --- | --- |
| MgO (magnesia) | 0.025 weight parts |
| ZrO$_2$ (zirconia) | 0.040 weight parts |
| Y$_2$O$_3$ (yttria) | 0.0015 weight parts |
| (Dispersion medium) | |
| Dimethyl glutarate | 27 weight parts |
| Ethylene glycol | 0.3 weight parts |
| (Gellant) | |
| MDI resin | 4 weight parts |
| (Dispersant) | |
| Polymeric surfactant | 3 weight parts |
| (Catalyst) | |
| N,N-dimethylamino hexanol | 0.1 weight parts |

The slurry was charged into a mold made of an aluminum alloy at room temperature. Then, the charged slurry was allowed to stand for one hour at room temperature. Then, the slurry was further allowed to stand at 40° C. for 30 minutes, whereby the solidification of the slurry proceeded, followed by mold-release. Subsequently, the solidified body was allowed to stand at room temperature and then at 90° C. each for two hours, thereby producing a plate-shaped powdery molded body.

The obtained powdery molded body was temporarily sintered (subjected to preliminary sintering) at 1100° C. in the atmosphere, and then sintered at 1750° C. under an atmosphere of a mixture of hydrogen and nitrogen at 3:1 ratio, followed by the annealing process under the same conditions, thereby producing a blank substrate.

The fabricated blank substrate was subjected to high precision-polishing. First, the blank substrate was shaped by double-sided lapping using green carbon, followed by another double-sided lapping using diamond slurry. The used diamond had a particle size of 3 μm. Finally, the CMP process was performed on the substrate, using SiO$_2$ abrasive grains and diamond abrasive grains, followed by cleaning, thereby producing a base substrate.

An alumina (Al$_2$O$_3$) layer was formed on the surface of the base substrate by vapor deposition after the cleaning. The purity of alumina was 100% by mass. An attained vacuum degree in deposition was $10^{-4}$ Pa; a temperature of the base substrate was 200° C.; a film thickness of the amorphous layer was 3 μm; and a refractive index of the amorphous layer was 1.75. Thereafter, the annealing process was performed on the alumina layer at 800° C. in an atmospheric furnace.

Finally, the CMP process was applied to the amorphous layer after the deposition to thereby attain a desired surface roughness. As the abrasive grains, a SiO$_2$ slurry was used. After this process, the obtained substrate had a film thickness of 1.5 μm. As a result of measuring the surface roughness with the AFM, a surface roughness Ra was 0.5 nm.

Thereafter, the substrate was cleaned with the ammonia hydrogen peroxide, hydrochloric acid hydrogen peroxide, and sulfuric acid hydrogen peroxide. After the cleaning process, the surface of the deposited layer was observed with the AFM. The surface roughness Ra was 0.5 nm and did not change before and after the cleaning.

Further, the surface was observed with a total reflection X-ray fluorescence analysis (TXRF) to confirm the pollution by the surface metal elements.

An incident angle of the X-ray beam was set at 0.03°, and X-ray conditions were set as follows: 40 mV and 40 mA. As a result, the concentration of each of Na, Mg, K, Ca, Ti, Cr, Fe, Ni, Cu, and Zn was confirmed to be $1.0 \times 10^{11}$ atom/cm$^2$ or less.

Bonding between the completed handle substrate with the amorphous layer and a Si wafer (donor substrate) was evaluated. The bonding was performed by a plasma activation method. After the bonding, the annealing was performed at a low temperature of 100° C., and further the annealing process was performed at 200° C. For this substrate, bonding energy of the substrate in a wafer state was evaluated in a blade test and determined to be 1 J/m$^2$, whereby the sufficient bonding strength of the wafer was confirmed to be obtained.

Comparative Example 1

In this comparative example, a crystal layer was provided on the surface of the base substrate made of the polycrystalline material.

First, a base substrate made of translucent alumina was fabricated in the same way as in Example 1. Sequentially, an alumina film was formed in a thickness of 3 μm on the surface of the base substrate by the vapor deposition. Then, the annealing process was performed at 1000° C. using the atmospheric furnace. Finally, the CMP process was performed on the alumina film. As a result, Ra after the CMP process was determined to be 6 nm. When the annealing temperature was around 1000° C., α-alumina crystals were generated to make the alumina film into the crystal state. As a result, it has been revealed that in Comparative Example 1, the desired surface roughness cannot be obtained by the CMP process.

Example 2

To confirm the effects of the invention, an amorphous Si layer was formed on a base substrate made of translucent alumina ceramic by the CVD, thereby producing a sample of a handle substrate.

First, a blank substrate made of translucent alumina ceramic was fabricated.

Specifically, a slurry containing a mixture of the following components was prepared.
(Powdery Raw Material)

α-alumina powder having a specific surface area of 3.5 to 4.5 m$^2$/g and an average primary particle size of 0.35 to 0.45 μm

|  | 100 weight parts |
| --- | --- |
| MgO (magnesia) | 0.025 weight parts |
| ZrO$_2$ (zirconia) | 0.040 weight parts |
| Y$_2$O$_3$ (yttria) | 0.0015 weight parts |
| (Dispersion medium) | |
| Dimethyl glutarate | 27 weight parts |
| Ethylene glycol | 0.3 weight parts |
| (Gellant) | |
| MDI resin | 4 weight parts |
| (Dispersant) | |
| polymeric surfactant | 3 weight parts |
| (Catalyst) | |
| N,N-dimethylamino hexanol | 0.1 weight parts |

The slurry was charged into a mold made of an aluminum alloy at room temperature. Then, the charged slurry was allowed to stand for one hour at room temperature. Subsequently, the slurry was further allowed to stand at 40° C. for 30 minutes, whereby the solidification of the slurry proceeded, followed by the mold-release. Then, the solidified body was allowed to stand at room temperature and then at 90° C. each for two hours, thereby producing a plate-shaped powdery molded body.

The obtained powdery molded body was temporarily sintered (subjected to preliminary sintering) at 1100° C. in the atmosphere, and then sintered at 1750° C. under an atmosphere of a mixture of hydrogen and nitrogen at 3:1 ratio, followed by the annealing process on the same conditions, thereby producing the blank substrate.

The fabricated blank substrate was subjected to high precision-polishing. First, the blank substrate was shaped by double-sided lapping using green carbon, followed by another double-sided lapping using a diamond slurry. The used diamond had a particle size of 3 μm. Finally, the CMP process was performed on the substrate, using SiO$_2$ abrasive grains and diamond abrasive grains, followed by cleaning, thereby producing a base substrate.

An amorphous Si layer was formed on the surface of the base substrate by decompression CVD after the cleaning. The deposition conditions were the use of disilane gas, the temperature of 400° C., and the film thickness of 1 μm. Subsequently, the amorphous Si layer was oxidized at 600° C. under the oxidation atmosphere for three hours, thereby producing an oxide film (amorphous SiO$_2$ layer) having a thickness of 1.5 μm. Thereafter, the annealing process was performed on the amorphous layer at 800° C. in an atmospheric furnace.

The CMP process was applied to the obtained amorphous SiO$_2$ layer to thereby attain a desired surface roughness. As the abrasive grains, a SiO$_2$ slurry was used. After this process, the obtained substrate had a film thickness of 1.0 μm. As a result of measuring the surface roughness with the AFM, a surface roughness Ra was 0.5 nm.

Thereafter, the substrate was cleaned with the ammonia hydrogen peroxide, hydrochloric acid hydrogen peroxide, and sulfuric acid hydrogen peroxide. After the cleaning process, when the surface roughness of the amorphous SiO$_2$ layer was observed with the AFM, it was confirmed that the surface roughness Ra was 0.5 nm and did not change before and after the cleaning.

Further, the surface was observed with TXRF (total reflection X-ray fluorescence analysis) to measure the pollution level. As a result, the concentration of each of Na, Mg, K, Ca, Ti, Cr, Fe, Ni, Cu, and Zn was confirmed to be $1.0 \times 10^{11}$ atom/cm$^2$ or less.

The bonding between the completed handle substrate and the Si wafer was evaluated. The bonding was performed by the plasma activation method. After the bonding, the annealing process was performed at 100° C., and further the annealing process was performed at 200° C. Thereafter, bonding energy of the substrate in a wafer state was evaluated in a blade test and determined to be 1 J/m$^2$. In this way, the sufficient bonding strength of the wafer was confirmed to be obtained.

Example 3

The handle substrate was fabricated in the same way as in Example 1. Note that no amorphous alumina layer was formed on the base substrate. Instead, an amorphous silicon nitride layer having a thickness of 1.0 μm was formed on the base substrate by the plasma CVD method, followed by the annealing process at 800° C. in the atmospheric furnace. Other steps were performed in the same manner as in Example 1.

The CMP process was applied to the obtained amorphous silicon nitride layer to thereby attain a desired surface roughness. As the abrasive grains, a SiO$_2$ slurry was used. After this process, the obtained substrate had a film thickness of 1.0 μm. As a result of measuring the surface roughness with the AFM, a surface roughness Ra was 0.5 nm.

Thereafter, the substrate was cleaned with the ammonia hydrogen peroxide, hydrochloric acid hydrogen peroxide, and sulfuric acid hydrogen peroxide. After the cleaning process, when the surface roughness of the amorphous silicon nitride layer was observed with the AFM, it was confirmed that the surface roughness Ra was 0.5 nm and did not change before and after the cleaning. Further, the surface was observed with TXRF (total reflection X-ray fluorescence analysis) to confirm the pollution level. As a result, the concentration of each of Na, Mg, K, Ca, Ti, Cr, Fe, Ni, Cu, and Zn was confirmed to be $1.0 \times 10^{11}$ atom/cm$^2$ or less.

The bonding between the completed handle substrate and the Si wafer was evaluated. The bonding was performed by the plasma activation method. After the bonding, the annealing process was performed at 100° C., and further the annealing process was performed at 200° C. Thereafter, bonding energy of the substrate in this state was evaluated in a blade test and determined to be 1 J/m$^2$. In this way, the sufficient bonding strength was confirmed to be obtained.

Example 4

The handle substrate was fabricated in the same way as in Example 1. Note that no amorphous alumina layer was formed on the base substrate. Instead, an amorphous aluminum nitride layer having a thickness of 1.0 μm was formed on the base substrate by the sputtering, followed by the annealing process at 800° C. in the atmospheric furnace. Other steps were performed in the same manner as in Example 1.

The CMP process was applied to the obtained amorphous aluminum nitride layer to thereby attain a desired surface roughness. As the abrasive grains, SiO$_2$ slurry was used. After this process, the obtained substrate had a film thickness of 1.0 μm. As a result of measuring the surface roughness with the AFM, a surface roughness Ra was 0.5 nm.

Thereafter, the substrate was cleaned with the ammonia hydrogen peroxide, hydrochloric acid hydrogen peroxide, and sulfuric acid hydrogen peroxide. After the cleaning process, when the surface roughness of the amorphous aluminum nitride layer was observed with the AFM, it was confirmed that Ra value was 0.5 nm and did not change before and after the cleaning. Further, the surface was observed with TXRF (total reflection X-ray fluorescence analysis) to confirm the pollution level. As a result, the concentration of each of Na, Mg, K, Ca, Ti, Cr, Fe, Ni, Cu, and Zn was confirmed to be $1.0 \times 10^{11}$ atom/cm$^2$ or less.

The bonding between the completed handle substrate and the Si wafer was evaluated. The bonding was performed by the plasma activation method. After the bonding, the annealing process was performed at 100° C., and further the annealing process was performed at 200° C. Thereafter, bonding energy of the substrate in this state was evaluated in a blade test and determined to be 1 J/m$^2$. In this way, the sufficient bonding strength was confirmed to be obtained.

Comparative Example 2

A base substrate made of a polycrystalline alumina ceramic with a high purity was fabricated in the same way as in Example 1. An alumina film with a low purity (95% purity) was formed on the base substrate by vapor deposition. Then, the substrate with the alumina film was subjected to the annealing process at 800° C. and subsequently to the CMP process, causing its surface to be polished. This was washed with ammonia hydrogen peroxide, and hydrochloric acid hydrogen peroxide, followed by observation of the surface with the AFM. As a result, a number of pits with a depth of 50 nm were recognized at the surface. Further, when measuring the amount of metallic elements on the surface by means of the TXRF, the amount of each of Ta, W, and Fe was determined to be more than 100E10 atoms/cm$^2$ or more, i.e. Ta, W, or Fe>100E10 atoms/cm$^2$. It was confirmed that the adequate suppression of the surface pollution level cannot obtained.

The invention claimed is:

1. A method for manufacturing a composite substrate for a semiconductor, said method comprising the steps of:
    forming a thin layer of an amorphous material over a base substrate comprising a polycrystalline material, said amorphous material comprising alumina and said polycrystalline material comprising alumina;
    then performing an annealing process of said thin layer at a temperature of 650° C. or higher and 1000° C. or lower to thereby form an amorphous layer having a chemical resistance and comprising alumina with a high purity;
    then processing a bonding surface of said amorphous layer by chemical mechanical polishing, so that a surface roughness Ra of said bonding surface of said amorphous layer is made 1 nm or less, wherein said amorphous layer has a thickness of 3 μm or less and 1 μm or more; and
    then bonding said donor substrate to said bonding surface of said amorphous layer so that said donor substrate directly contacts said bonding surface.

2. The method of claim 1, wherein said amorphous layer is formed by chemical vapor deposition, sputtering, vapor deposition, or ion plating.

* * * * *